(12) United States Patent
Wu et al.

(10) Patent No.: US 8,307,261 B2
(45) Date of Patent: Nov. 6, 2012

(54) NON-VOLATILE MEMORY MANAGEMENT METHOD

(75) Inventors: Cheng Wen Wu, Hsinchu (TW); Te Hsuan Chen, Hsinchu (TW); Yu Ying Hsiao, Hsinchu (TW); Yu Tsao Hsing, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 856 days.

(21) Appl. No.: 12/435,055

(22) Filed: May 4, 2009

(65) Prior Publication Data

US 2010/0281341 A1    Nov. 4, 2010

(51) Int. Cl.
*G11C 29/00* (2006.01)
*H03M 13/00* (2006.01)

(52) U.S. Cl. ........ 714/766; 714/763; 714/768; 714/782; 714/799; 365/200; 365/201

(58) Field of Classification Search .................. 714/763, 714/782, 785, 766, 768, 799; 365/200, 201
See application file for complete search history.

(56) References Cited

U.S. PATENT DOCUMENTS

| | | | | |
|---|---|---|---|---|
| 6,560,745 B1 * | 5/2003 | McCloskey et al. | .......... | 714/775 |
| 7,209,306 B2 * | 4/2007 | Nakamura | ..................... | 360/48 |
| 7,237,183 B2 * | 6/2007 | Xin | ................................ | 714/782 |
| 7,673,221 B2 * | 3/2010 | Li et al. | ......................... | 714/774 |
| 7,681,110 B2 * | 3/2010 | Lin et al. | ....................... | 714/785 |
| 7,698,619 B1 * | 4/2010 | Liu | ................................ | 714/752 |
| 7,702,954 B2 * | 4/2010 | Yoshida | ....................... | 714/6.12 |
| 7,809,994 B2 * | 10/2010 | Gorobets | ......................... | 714/52 |
| 8,015,473 B2 * | 9/2011 | Eilert et al. | ................... | 714/773 |
| 8,019,601 B2 * | 9/2011 | Eguchi | ......................... | 704/230 |
| 2007/0171714 A1 * | 7/2007 | Wu et al. | ................... | 365/185.09 |
| 2007/0300130 A1 * | 12/2007 | Gorobets | ....................... | 714/766 |
| 2008/0091971 A1 * | 4/2008 | Yoshida | ............................ | 714/5 |
| 2008/0282106 A1 * | 11/2008 | Shalvi et al. | ...................... | 714/6 |
| 2009/0144598 A1 * | 6/2009 | Yoon et al. | ..................... | 714/752 |
| 2009/0276680 A1 * | 11/2009 | Chiu | ............................. | 714/752 |
| 2010/0100763 A1 * | 4/2010 | Chen | ................................. | 714/6 |
| 2010/0205504 A1 * | 8/2010 | Fung et al. | ..................... | 714/752 |

* cited by examiner

*Primary Examiner* — John J Tabone, Jr.
(74) *Attorney, Agent, or Firm* — WPAT, P.C.; Anthony King

(57) ABSTRACT

A management method for a non-volatile memory comprises the steps of providing the non-volatile memory with at least one block having a plurality of pages to store user data and parity data; dividing at least one of the pages into a plurality of partitions each including the user data and parity data; determining codeword length of each of the partitions, the codeword length comprising message length with sufficient storage to store the user data and parity length storing the parity data; and storing extra parity data in the partition with the codeword length. When storing extra parity data in the codeword length, the parity length is increased and the message length is decreased.

14 Claims, 7 Drawing Sheets

NON-VOLATILE MEMORY MANAGEMENT METHOD

BACKGROUND OF THE INVENTION (A) Field of the Invention

The present invention is related to a memory management method, and more specifically, to a management method for a non-volatile memory.

(B) Description of the Related Art

In recent years the demand for storage systems is increasing due to the rapid development of modern consumer products, such as thumb drives, digital cameras, MP3 players, etc. Larger storage spaces allow for storage of more information or data. To maintain the data when the devices are off, flash memory is indispensable to these devices. However, with the continuing size reduction, flash memory faces many serious issues in yield, reliability, and endurance. To increase the yield, built-in self testing and diagnosis designs are often added. As for increasing the reliability and endurance, redundant elements (i.e. spare elements) and fault tolerant methods are often proposed. One of the cost-effective fault tolerant designs for memory is the error-correction code (ECC). By applying the ECC mechanism to memory, a certain number of errors can be corrected or detected. Due to the endurance and reliability issues of flash memory, ECC is becoming increasingly important to flash memory. One of the common error-correction codes in commercial NAND flash is the Bose-Chaudhuri-Hocquenghem (BCH) code. The BCH code performs multiple-error correction. It is widely used in flash memory. The BCH code can be defined easily by two parameters selected by the designer.

Although flash memory uses the ECC for improving reliability and endurance issues, the reliability of a flash memory nevertheless decreases with time when it is in user mode. This is because program and erase operations of flash memory are destructive. The more users store or delete data in flash memory, the more cells will be damaged. Finally, the errors will exceed the designed correction capability and the flash memory device can no longer be repaired. Under such situation, the entire flash memory module or memory block must be abandoned while most of its memory cells are still functioning. Consequently, the lifetime of the flash memory device is significantly less than the lifetime of most of its memory cells.

SUMMARY OF THE INVENTION

The present invention provides a memory management method for a non-volatile memory, in order to increase the lifetime of the memory device.

According to the present invention, an embodiment of a management method for a non-volatile memory comprises the steps of providing the non-volatile memory with at least one block having a plurality of pages to store user data and parity data; dividing at least one of the pages into a plurality of partitions each including the user data and parity data; determining codeword length of each of the partitions, the codeword length comprising message length with sufficient storage to store the user data and parity length storing the parity data; and storing extra parity data in the partition with the codeword length.

In an embodiment, the extra parity data can be further stored in one or more extra parity pages selected from the block, and those extra parity pages do not store user data.

DETAILED DESCRIPTION OF THE INVENTION

The present invention will be explained with the appended drawings to clearly disclose the technical characteristics of the present invention.

Figure 1:
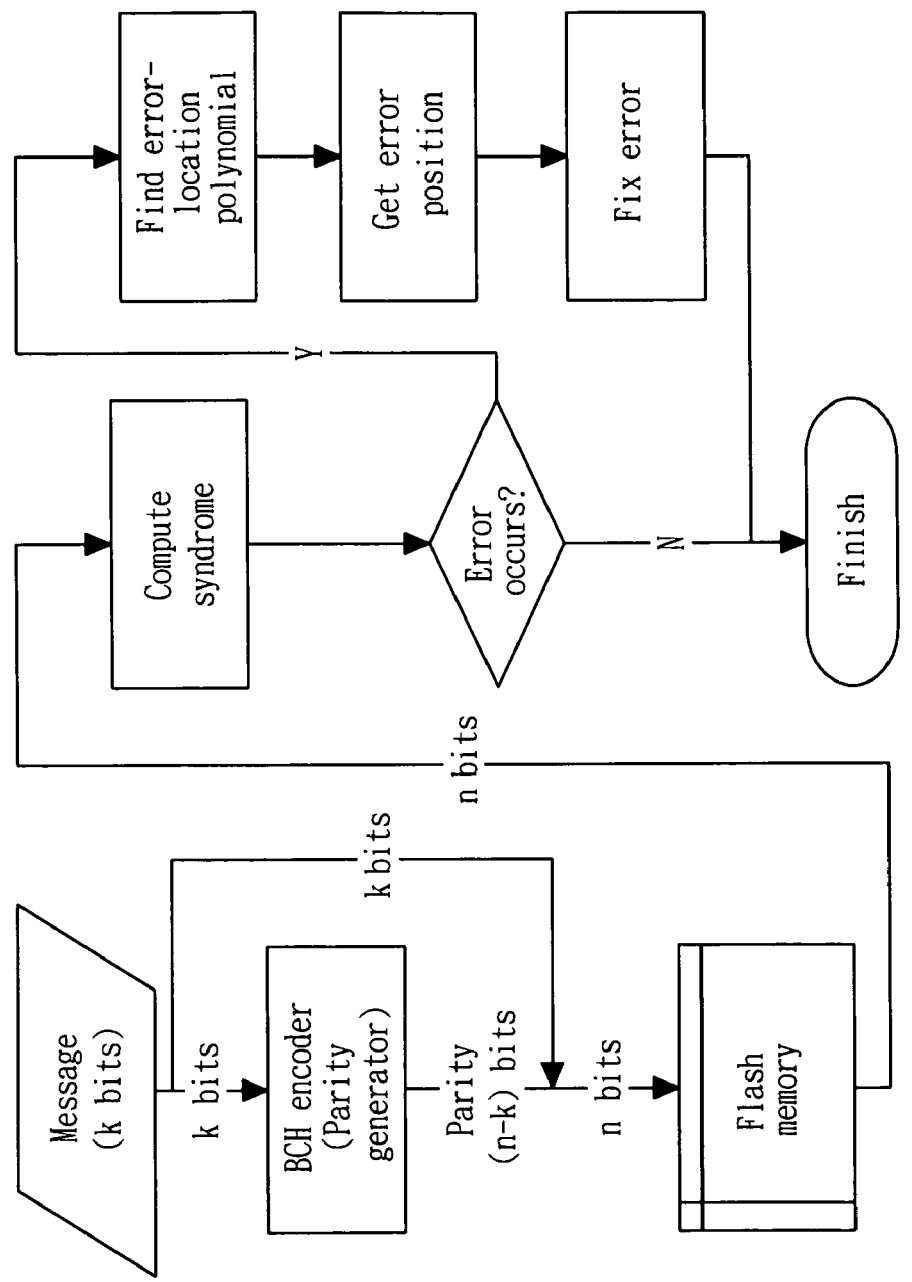
FIG. 1 illustrates a flow of BCH codec.

The BCH encoding and decoding flow are described below. Assume a k-bit message is encoded to form an n-bit codeword. FIG. 1 illustrates the flow of the BCH codec. The k-bit message is input to the BCH encoder which generates (n−k)-bit parity. After encoding, the (n−k)-bit parity together with k-bit message form a codeword which is stored into the memory. To decode the data, the n-bit data is retrieved from the memory and is put into the syndrome computation block. If there is no error in the retrieved data, the syndrome should be all zero and the decoding procedure is finished. Otherwise the syndrome should be sent into the error-location block to get the error-location polynomial (ELP). After obtaining the error-location polynomial, an error position block is used to find out which bits are erroneous. Finally, the corrected message is obtained.

Figure 2:
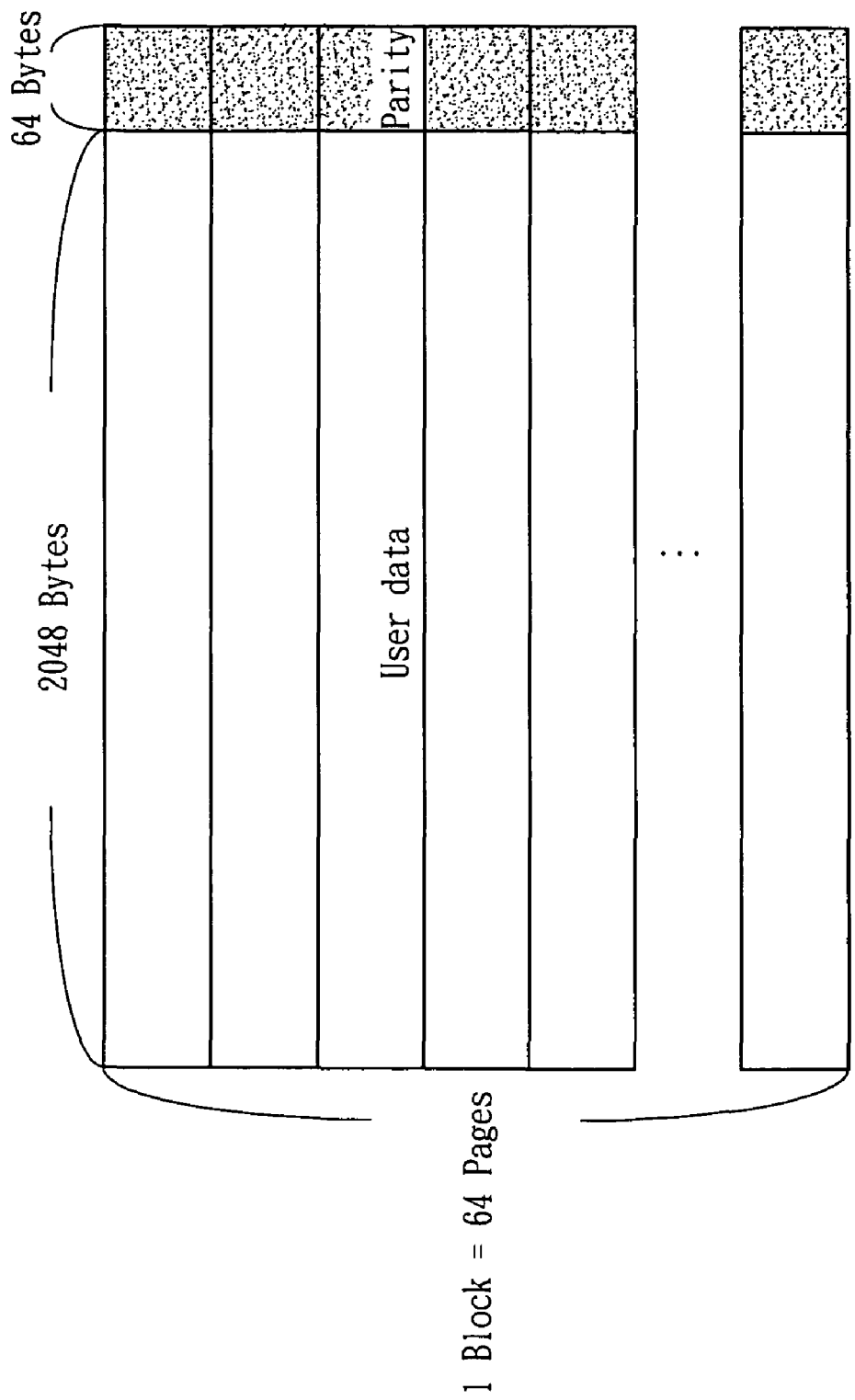
FIGS. 2 to 6 illustrate the management method for a non-volatile memory in accordance with an embodiment of the present invention.

With the basic concept of the BCH code and the corresponding implementations, the present invention introduces a proposed adaptive-rate BCH scheme for a non-volatile memory such as a flash memory. Adaptive-rate here represents a changeable correction capability, that is, variable t. For example, the ECC may be implemented in a flash memory controller. The memory has several blocks, and each block has 64 pages. Every page contains 2048 bytes data with 64 bytes parity, as shown in FIG. 2.

Figure 3:
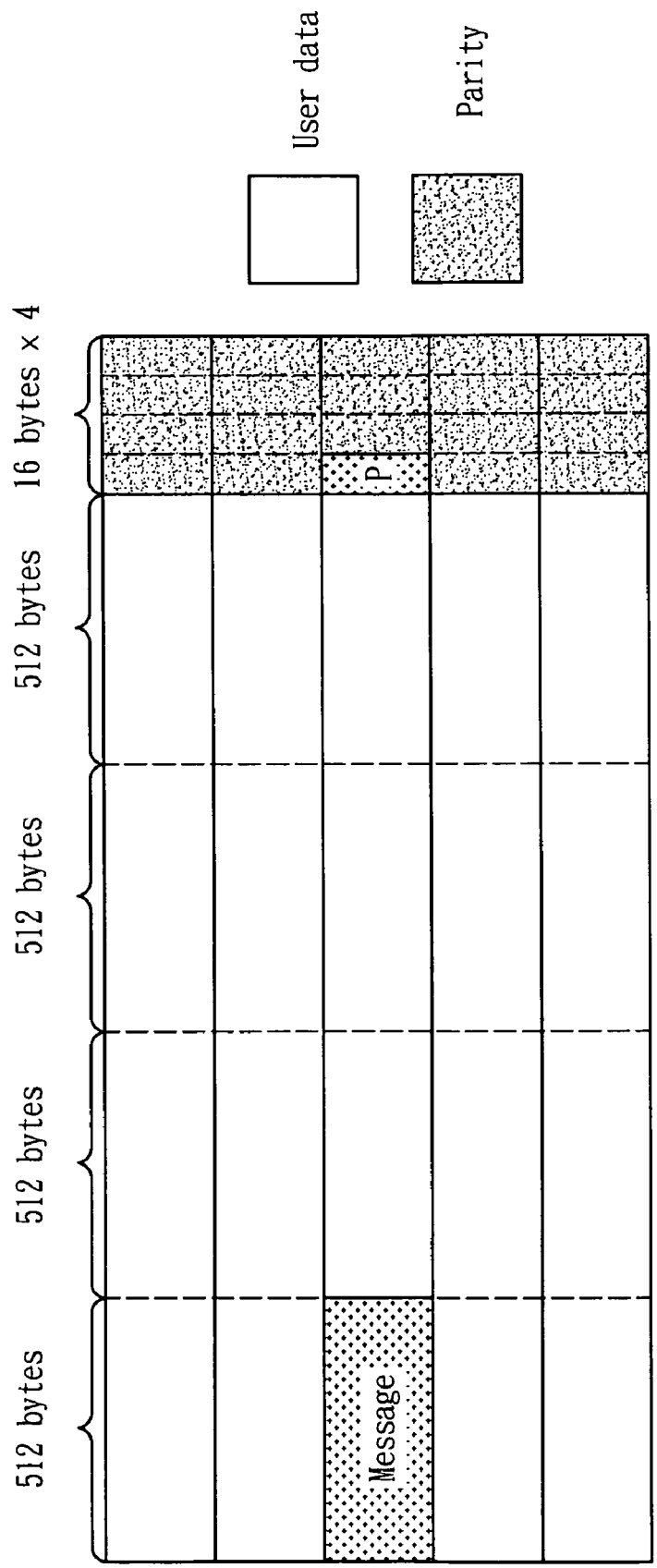

In addition, one page is divided into four partitions as shown in FIG. 3. Each partition is composed of 512 bytes data with 16 bytes parity. Because $2^{12}-1<(512+16)\times 8<2^{13}-1=8191$, the target (n, k, t) BCH code should be built over $GF(2^{13})$, where GF is Galois field. The codeword length n is $2^{13}-1=8191$ and parity length n−k is 13t in this case. In other words, the codeword length is determined by $n=2^m-1$, where n is the codeword length, and m is determined using $2^{m-1}-1<$ bits of the user data and the parity data $<2^m-1$. For simplicity, assume all the redundant parts of the flash memory are for the use of parity storage, although in actual cases the flash controller stores its controlling flags here. Accordingly, the correction capability is $$t = \left[\frac{16\times 8}{13}\right] = 9.$$

Figure 4:
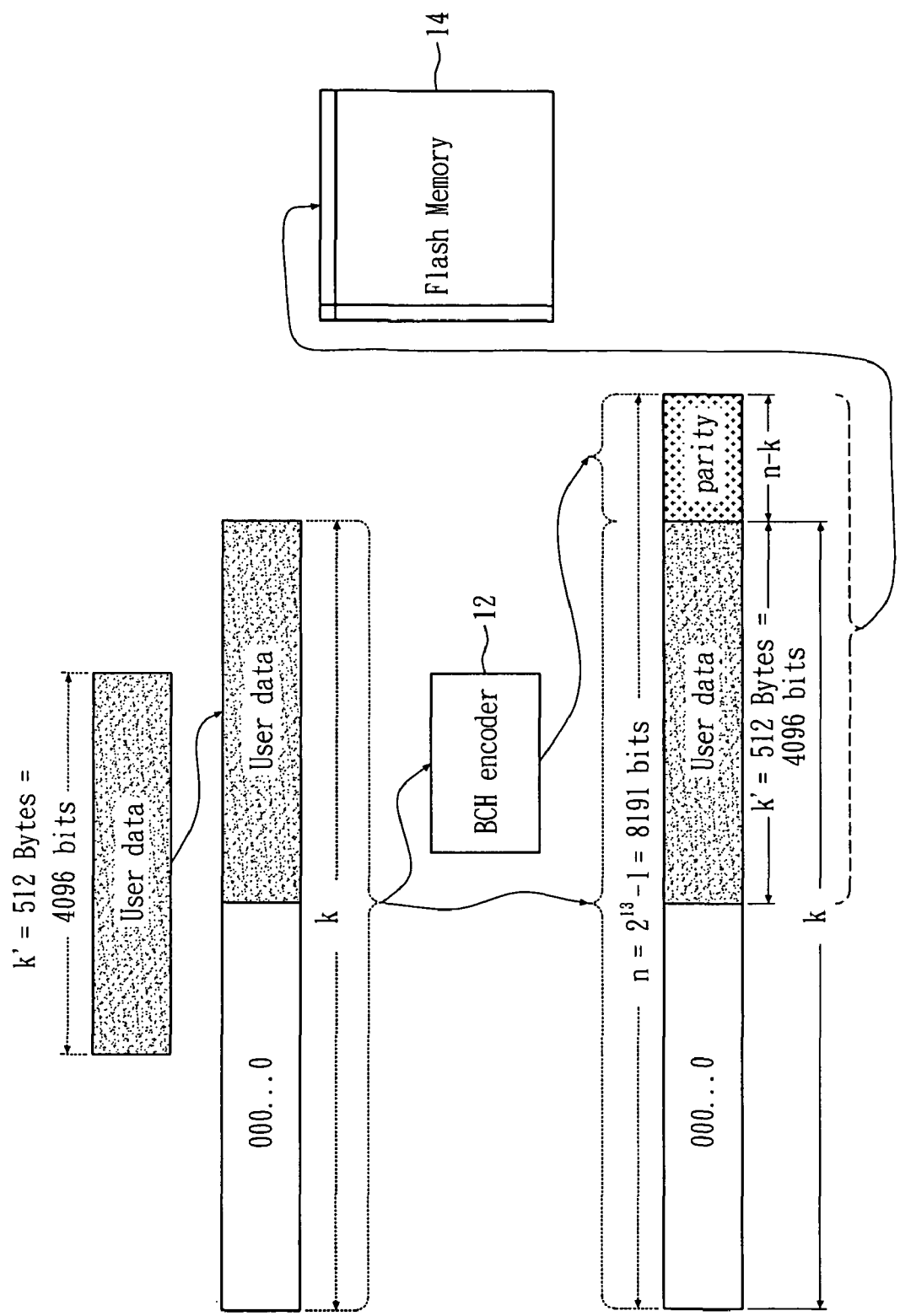

As FIG. 4 shows, user data of a partition is 512 Bytes (k'=4096 bits). However, for the n=8191 BCH code, it extends from 4096 bits to k bits with 0 ahead of the user data.

This is called a message length with k bits. Because the implementation of the BCH encoder 12 is based on the Linear Feedback Shift Register (LFSR), the MSB will be shifted to the encoder 12 first. Therefore for the k-bit data which contains (k−4096) 0s as shown in FIG. 4, the operation of the BCH encoder can be reduced to 4096 clock cycles instead of k clock cycles with all D-type flip-flops initialized to 0. The configuration is implemented in the flash memory 14. The codeword length n is the sum of the message length k and the parity length n−k.

Because user data is 512 Bytes (k'=4096 bits), the maximum length of the parity bits can be 8191−4096=4095 bits so the maximum correction capability is $$t_{max} = \left\lceil \frac{8191 - 4096}{13} \right\rceil = 315.$$

The codewords may be of different error capabilities. Consequently, the code rate k/n can be changed to increase the error capability.

As the memory is programmed and erased over time, the parities are increased accordingly. The extra or added parity data is stored in the codeword length n, and consequently, the parity length n−k is increased and the message length k is decreased.

Figure 5:
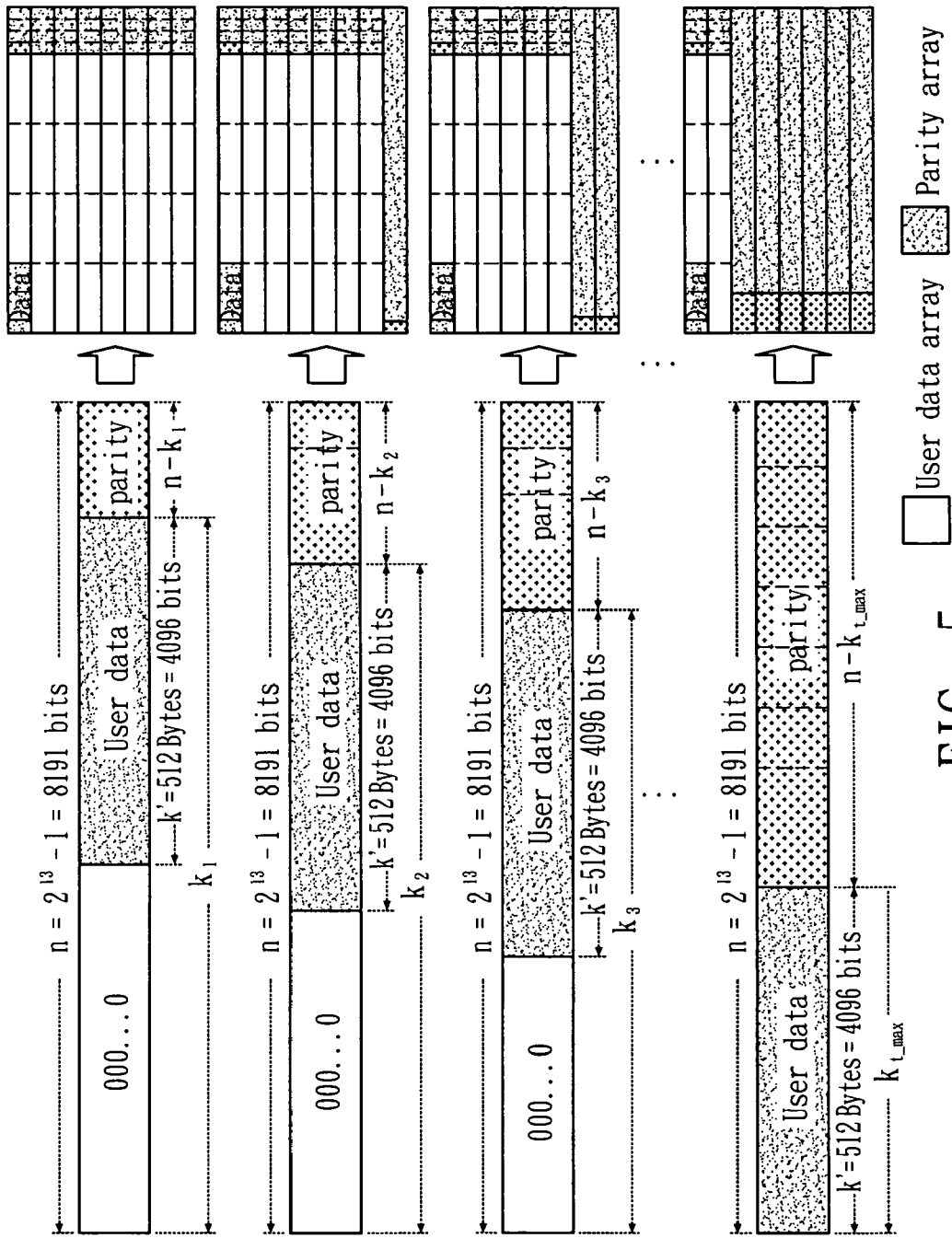

In the proposed adaptive-rate error correction scheme, a BCH codec that has four operation modes is designed. Different modes have different error correction capabilities while they all operate over the same Galois field. In FIG. 5, Mode 0 is the initial mode and uses the designed 16 Bytes spare memories to get t=9. There are 117 bits parity in mode 0. To increase the correction capability the code rate is changed thereby increasing the parity bits. Therefore if t>9 is desired, the parity bits need to be stored in the main memory array, reducing the user capacity to increase reliability. In Mode 1, one page of the main memory array is traded for higher correction capability. Each partition has $$\left\lceil \frac{2048 + 64}{63 \times 4} \right\rceil = 8$$

byte extra parity. Therefore 16+8 bytes spaces is for Mode 1 and $t_{m1}=$ $$\left\lceil \frac{(16 + 8) \times 8}{13} \right\rceil = 14.$$

Mode 1 has 182 parity bits. Modes 2 and 3 are similar to Mode 1 except they use 2 and 3 extra parity pages, respectively, which have 247 or 312 bits parity and correct 19 or 24 bits errors. In other words, extra parity data can be stored in one or more extra parity page, the extra parity page is one of the pages without the user data. Usually, the extra parity page is the bottommost page of the block.

Figure 6:
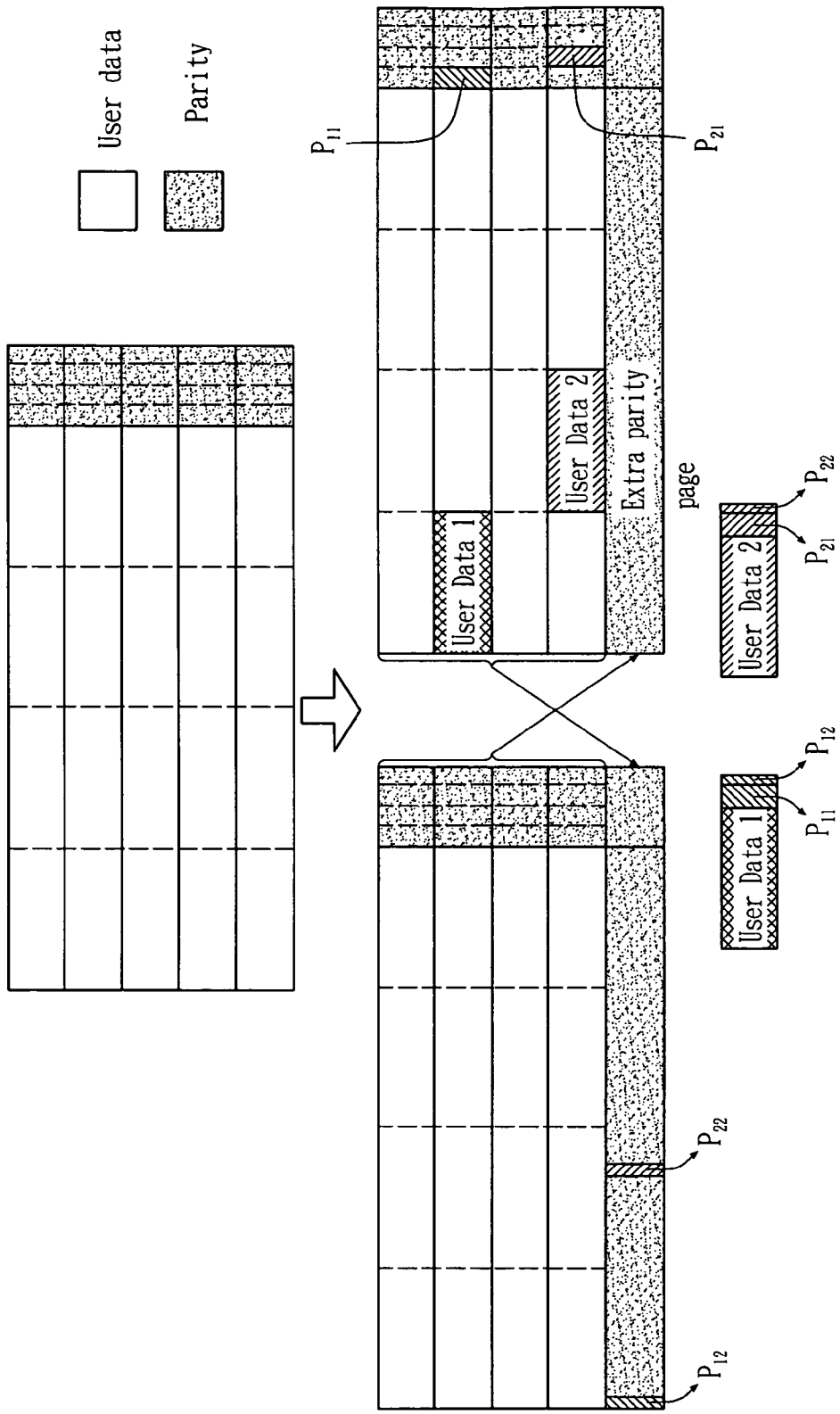

In the error correction scheme of the present invention, an extra parity page is used to store the parity bits. However, most of the flash memories are designed to be accessed page by page in one block. If the extra parity page and corresponding user data are in the same block, the block needs to be read twice. To alleviate such inefficiency, two-plane operations are used in flash memory, which enable a simultaneous operation of two pages as shown in FIG. 6. For example, User Data 1 refers to parity data $P_{11}$ and $P_{12}$, whereas User Data 2 refers to parity data $P_{21}$ and $P_{22}$. To read User Data 1, the page including $P_{11}$ and the extra parity page including $P_{12}$ are accessed simultaneously. Likewise, to read User Data 2, the page including $P_{21}$ and the extra parity page including $P_{22}$ are accessed simultaneously.

Using the two-plane operations, the access time can be reduced. In addition to the two-plane operations, there exists another solution. The ECC codec of the present invention is designed for a flash memory controller, and the flash controller can support two flash modules and use two flash memory modules to form a pair. Therefore, two pages can be assessed simultaneously.

Because extra parity pages are used to store the parity, these pages will be accessed more frequently than others. The lifetime of the extra parity pages will much shorter than those that are not extra parity pages. For that reason, the extra parity pages should be equally distributed among all blocks. This distribution can be efficiently solved by software designers.

Figure 7:
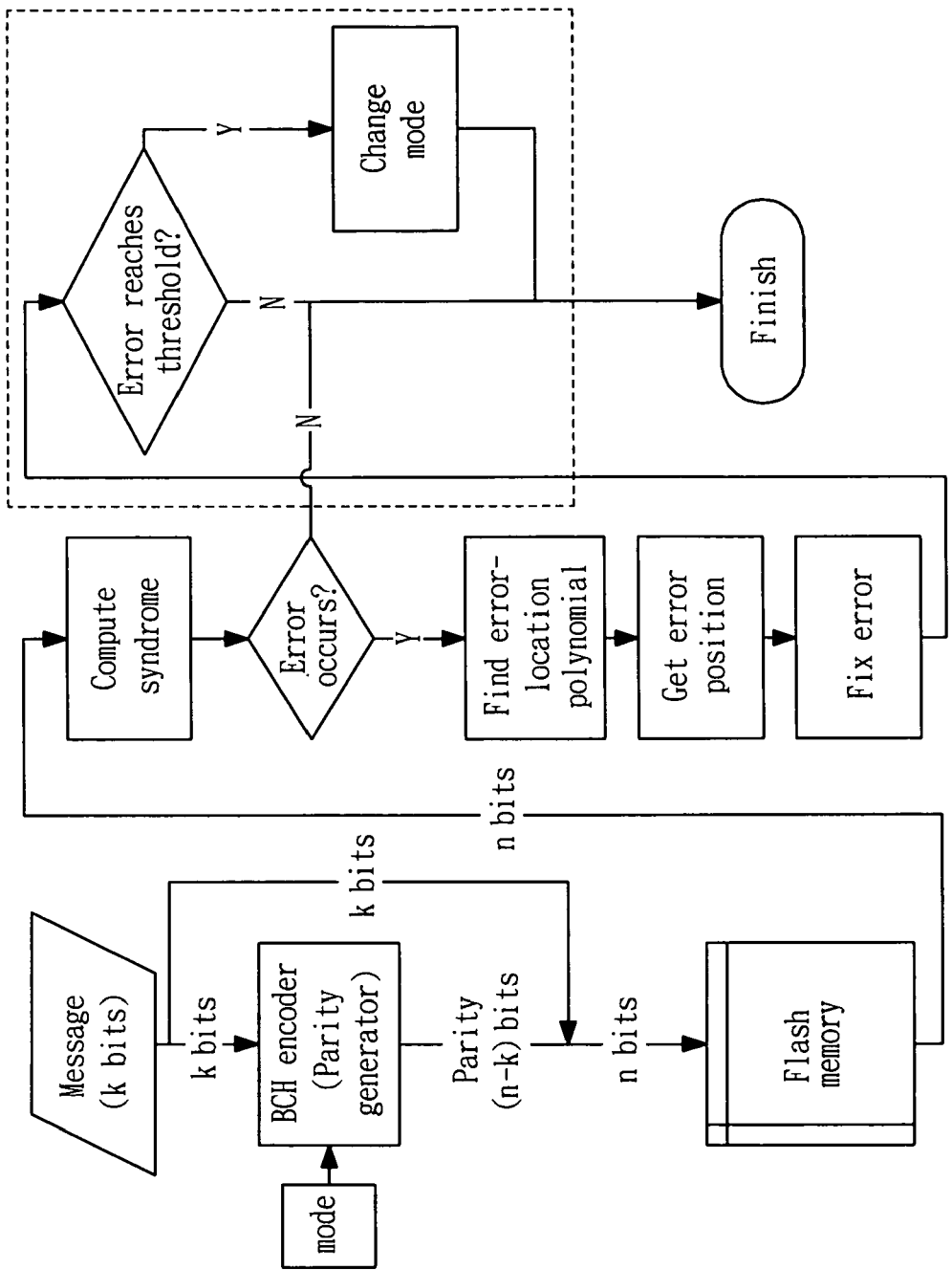
FIG. 7 illustrates a flow of BCH codec in accordance with the present invention.

FIG. 7 illustrates the flow of the present invention. In comparison with FIG. 1, the mode can be changed if the number of errors reaches a threshold value, and the mode is an input for BCH encoder for a parity generator.

The adaptive-rate ECC has three main applications: static, dynamic, and a combination of both. The static application is adopted after the flash memories are fabricated and subjected to production tests because the yield of the flash memories can be obtained after testing. Therefore, an appropriate ECC strategy can be selected (i.e., the ECC mode) to increase the utilization of manufactured flash memories.

The dynamic application is more complicated and requires the integration of algorithms run by the micro controller in the flash memory controller to dynamically change the ECC strategy when the user uses the flash memory. For instance, suppose all pages in the same block use the same mode. When the mode is shifted to a new one after a certain partition is read in a block, the data in other partitions in that block need to be moved to another block that is still kept in the same original mode or be re-encoded to store in this block. These operations need the cooperation of the micro controller in flash memory controller.

Given the above, the parity data can be stored in the available space of same page or in one or more extra parity pages. Accordingly, the memory device can be still used, even though the amount of parity data exceeds the threshold of page storage. In other words, if some memory cells are good, the memory still can be used, thereby significantly increasing the lifetime of the memory device.

The above-described embodiments of the present invention are intended to be illustrative only. Numerous alternative embodiments may be devised by those skilled in the art without departing from the scope of the following claims.

What is claimed is:

1. A management method for a non-volatile memory, comprising the steps of:
   providing the non-volatile memory with at least one block having a plurality of pages to store user data and parity data;
   dividing at least one of the pages into a plurality of partitions each including the user data and parity data;
   determining codeword length of each of the partitions, the codeword length comprising message length with sufficient storage to store the user data and parity length storing the parity data;
   generating first and second extra parity data corresponding to the user data; and storing the first and second extra parity data in different extra parity pages selected from the plurality of pages.

2. The management method for a non-volatile memory of claim 1, wherein the codeword length is determined by Bose-Chaudhuri-Hocquenghem code.

3. The management method for a non-volatile memory of claim 1, wherein the codeword length is the sum of the message length and the parity length.

4. The management method for a non-volatile memory of claim 1, wherein the message length comprises bits with 0 ahead of the user data.

5. The management method for a non-volatile memory of claim 1, wherein the codeword length is determined by $n=2^m-1$, where n is the codeword length, and m satisfies the equation:

$$2^{m-1}-1 < \text{bits of the user data and the parity data} < 2^m-1.$$

6. The management method for a non-volatile memory of claim 1, further comprising the step of accessing the user data by simultaneously operating the page of the user data and one of the extra parity pages.

7. The management method for a non-volatile memory of claim 1, wherein the first and second extra parity pages are bottom-most pages of the block.

8. A management method for a non-volatile memory, comprising the steps of:
providing the non-volatile memory with at least one block having a plurality of pages to store user data and parity data;
dividing at least one of the pages into a plurality of partitions each including the user data and parity data;
determining codeword length of each of the partitions, the codeword length comprising message length with sufficient storage to store the user data and parity length storing the parity data;
generating first and second extra parity data respectively corresponding to the user data stored in different pages; and
storing the first and second extra parity data in a same extra parity page.

9. The management method for a non-volatile memory of claim 8, wherein the codeword length is determined by Bose-Chaudhuri-Hocquenghem code.

10. The management method for a non-volatile memory of claim 8, wherein the codeword length is the sum of the message length and the parity length.

11. The management method for a non-volatile memory of claim 8, wherein the message length comprises bits with 0 ahead of the user data.

12. The management method for a non-volatile memory of claim 8, wherein the codeword length is determined by $n=2^m-1$, where n is the codeword length, and m satisfies the equation:

$$2^{m-1}-1 < \text{bits of the user data and the parity data} < 2^m-1.$$

13. The management method for a non-volatile memory of claim 8, further comprising the step of accessing the user data by simultaneously operating the page of the user data and the extra parity page.

14. The management method for a non-volatile memory of claim 8, wherein the extra parity page is the bottom-most page of the block.

* * * * *